(12) United States Patent
Chiu et al.

(10) Patent No.: US 7,460,851 B2
(45) Date of Patent: Dec. 2, 2008

(54) METHOD AND APPARATUS FOR INTEGRATING A SURFACE ACOUSTIC WAVE FILTER AND A TRANSCEIVER

(75) Inventors: Yu-Ling Chiu, Taipei (TW); Tsyr-Shyang Liou, Taipei (TW)

(73) Assignee: Richwave Technology Corp., Taipei (TW)

( * ) Notice: Subject to any disclaimer, the term of this patent is extended or adjusted under 35 U.S.C. 154(b) by 560 days.

(21) Appl. No.: 11/269,729

(22) Filed: Nov. 9, 2005

(65) Prior Publication Data

US 2006/0105737 A1    May 18, 2006

(51) Int. Cl.
*H04B 1/28* (2006.01)
*H04B 1/46* (2006.01)
*H01L 21/00* (2006.01)

(52) U.S. Cl. .................... 455/333; 455/80; 455/81; 438/38

(58) Field of Classification Search ............ 455/73, 455/80, 81, 82, 23, 38, 108, 333; 333/173, 333/178, 184, 185; 438/23, 38, 108
See application file for complete search history.

(56) References Cited

U.S. PATENT DOCUMENTS

| | | | | |
|---|---|---|---|---|
| 5,821,425 A * | 10/1998 | Mariani et al. | ............... | 73/703 |
| 5,903,820 A * | 5/1999 | Hagstrom | .................... | 455/82 |
| 5,908,316 A * | 6/1999 | Le et al. | .................... | 438/362 |
| 5,928,598 A * | 7/1999 | Anderson et al. | ........... | 264/446 |
| 6,144,288 A * | 11/2000 | Jahn et al. | ................ | 340/10.33 |
| 6,285,866 B1 * | 9/2001 | Lee et al. | .................... | 455/318 |
| 6,754,471 B1 * | 6/2004 | Vakilian | ..................... | 455/73 |
| 7,016,655 B2 * | 3/2006 | Vakilian | ..................... | 455/73 |
| 7,167,688 B2 * | 1/2007 | Li et al. | ........................ | 455/88 |
| 7,379,751 B2 * | 5/2008 | Wada et al. | .............. | 455/552.1 |

* cited by examiner

*Primary Examiner*—Sonny Trinh
(74) *Attorney, Agent, or Firm*—Troxell Law Office, PLLC

(57) ABSTRACT

A method and an apparatus for integrating a surface acoustic wave (SAW) filter and a transceiver are provided to solve the problem of having a large area of the prior-art integration of a SAW filter and a transceiver; wherein a device for integrating a SAW filter and a transceiver is provided and a component stack method is used to accomplish the integration of the SAW filter and the transceiver, and thus besides featuring a low cost and a small area as well as avoiding a signal loss, the invention can further include a design of encapsulating other components and chips, or even suitable to be used for various integrated circuit packaging technologies (such as QFP and BGA, etc.)

20 Claims, 4 Drawing Sheets

METHOD AND APPARATUS FOR INTEGRATING A SURFACE ACOUSTIC WAVE FILTER AND A TRANSCEIVER

BACKGROUND OF THE INVENTION

1. Field of the Invention

The present invention relates to a method and an apparatus for integrating a surface acoustic wave (SAW) filter and a transceiver, more particularly to the design and concept of a component stack architecture.

2. Description of Related Art

As the wireless communication technology is developed rapidly, various mobile devices and wireless network products are introduced unceasingly to the market. In the wireless communication technology, a signal is received, demodulated, decoded and computed and then the signal is coded, modulated and transmitted. In general, the level of difficulty will be higher and the circuit operation will be less stable, if a high-frequency signal is converted into a digital signal. Therefore, the design of a wireless communication system includes a radio frequency (RF), an intermediate frequency (IF) and a signal operating base-band frequency (BB). In a detail circuit design, a surface acoustic wave (SAW) filter is usually added to a transceiver to filter the noise in a high-frequency signal. With the trend of the wireless communication products being light, thin, short and compact, the quantity and area of internal components of these products encounter a very big challenge. Therefore, the development of component integration has become an indispensable part of electronic products and technologies. Since the integration technology between high-frequency components and base-band components is very different due to the materials and characteristics of the components, and thus giving us plenty of room for further improvements.

Please refer to FIG. 1 for the schematic view of the structure of a device for integrating a SAW filter and a transceiver according to a prior art. Under the conditions of not affecting the performance of a SAW filter 13, most SAW filters 13 adopt a ceramic substrate package and keep their surfaces not in contact with each other to assure the performance of the SAW filter 13 due to the properties of the piezoelectric material in the SAW filter 13. However, such design still has the problem of being unable to reduce the package size of a SAW filter 13. Therefore, the integration between a SAW filter 13 and a transceiver 12 is accomplished by a printed circuit board 11. The transceiver 12 and the SAW filter 13 are built on the printed circuit board 11 for filtering the noise of a radio frequency (RF) signal.

In view of the description above, the foregoing prior-art SAW filer and transceiver are inconvenient and still have drawbacks in the actual practice, and thus requiring further improvements. The drawbacks are listed below:

1. The area of the SAW filter 13 is too large;

2. The SAW filter 13 is installed by itself and cannot be integrated into other components effectively;

3. There exists a problem of losing a signal easier when the signal is transmitted by the printed circuit board; and 4. Poor quality of a printed circuit board may cause a signal distortion or a system failure.

In view of the aforementioned drawbacks, the inventor of the present invention based on years of experience of the related field to conduct extensive researches and practice the theory, and finally invented a feasible design to effectively overcome the aforementioned drawbacks.

SUMMARY OF THE INVENTION

Therefore, it is a primary objective of the present invention to solve the problem of the large area of a prior-art surface acoustic wave (SAW) filter and provide a device for integrating a SAW filter and a transceiver, wherein a component stack method is used to accomplish the integration of the SAW filter and the transceiver. Firstly, a conductive layer is formed on a substrate, and a transceiver is disposed on the substrate, and then a SAW filter is disposed on the transceiver. The SAW filter includes an air cavity covering the SAW filter and a gap being reserved between the air cavity and the SAW filter. The conductive layer, SAW filter and transceiver are electrically connected with each other by a metal lead. Finally, a molding compound encapsulates the circuit among the substrate, transceiver and SAW filter wave component. The substrate used for the device according to the present invention could be substituted by a lead frame.

Another objective of the present invention is to provide a method of integrating a surface acoustic wave (SAW) filter and a transceiver, which comprises the steps of: disposing a substrate first; forming a conductive layer on the substrate; coating an epoxy layer on the substrate; disposing a receiver on the substrate; forming a thin isolation layer on the transceiver; disposing a SAW filter on the transceiver; electrically connecting the SAW filter wave, the transceiver and the conductive layer by a metal lead; encapsulating the circuit among the substrate, the transceiver and the SAW filter; and finally shaping an integrated chip. The substrate used in this method can be substituted by a lead frame.

In addition to the advantages of having a low cost and a small area as well as avoiding a signal loss, the device for integrating the surface acoustic wave (SAW) filter can be designed to include and encapsulate other components and chips.

To make it easier for our examiner to further understand the features and technical contents of the present invention, please refer to the detailed description and drawings of the present invention. However, the drawings are provided for the purpose of reference and description only, but not intended for limiting the scope of the present invention.

DETAILED DESCRIPTION OF THE PREFERRED EMBODIMENTS

Figure 1:
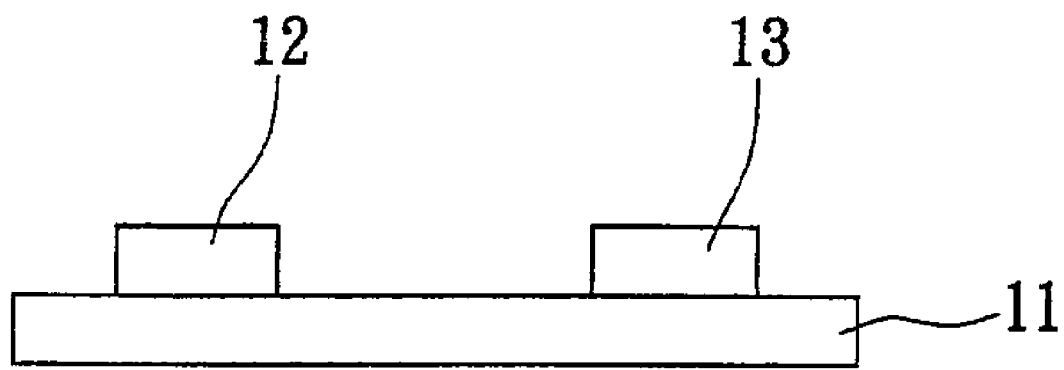
FIG. 1 is a schematic view of the device for integrating a surface acoustic wave (SAW) filter and a transceiver according to a prior art.
Figure 2:
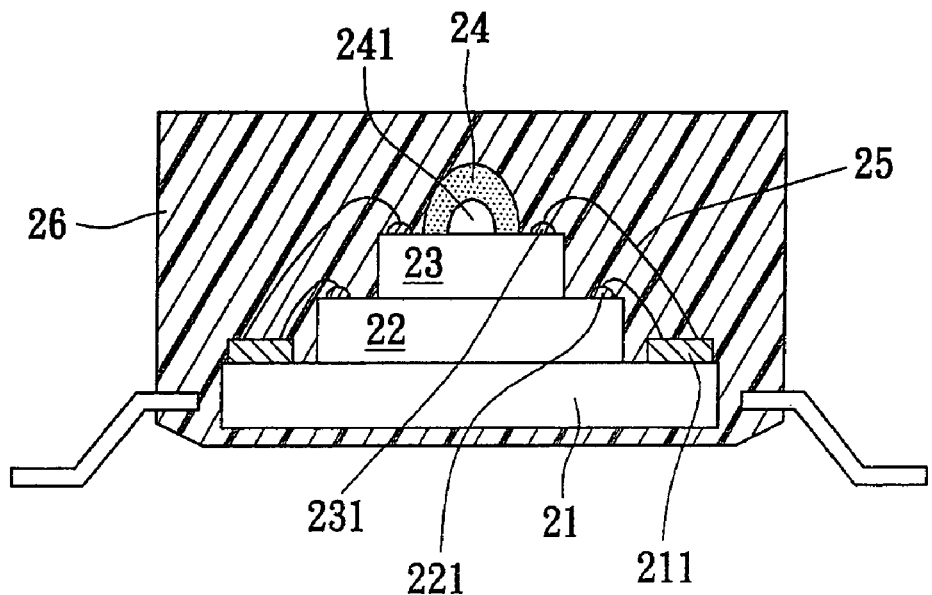
FIG. 2 is a schematic view of the device for integrating a surface acoustic wave (SAW) filter and a transceiver according to the invention.

Please refer to FIG. 2 for the device for integrating a surface acoustic wave (SAW) filter and a transceiver according to the present invention. The main improvement of the present invention over the prior art resides on using a component stack method to accomplish the integration of a SAW filter and a transceiver, and thus can dispose a transceiver on a SAW filter as to save the area occupied by the SAW filter and the cost incurred. The technical characteristics and features of the present inventions are described below. Please also refer to FIG. 2. A substrate 21 is formed on a conductive layer 221 for electrically coupling other components and the substrate 21 could be a semiconductor substrate or a glass substrate. A transceiver 22 is disposed on the substrate 21 and electrically coupled with the conductive layer 221 by a metal lead 25. In the connection between the transceiver 22 and the conductive layer 221, the transceiver 22 can install a plurality of pads 221 around it and the metal lead 25 can be connected to the plurality of pads 221 and the conductive layer 211 simultaneously.

A surface acoustic wave (SAW) filter 23 is disposed on the transceiver 22, and an air cavity 24 covers the SAW filter 23 and keeps a gap 241 between the air cavity 24 and the SAW filter 23, and the SAW filter 23 and the conductive layer 221 are electrically coupled by a metal lead 25; wherein the air cavity 24 is made of a semiconductor material or a glass material. The gap 241 could be filled with various kinds of gases or kept in a vacuum. In the connection between the SAW filter 23 and the conductive layer 221, a plurality of pads 231 can be installed around the SAW filter 23, and the metal lead is connected to the plurality of pads and the conductive layer 211 simultaneously by a metal lead 25. In the design of a circuit connection, the transceiver 22, the SAW filter 23 and the conductive layer 221 are electrically connected by a metal lead 25.

Then, a molding compound 26 is used to encapsulate the circuit among the substrate 21, the transceiver 22, and the SAW filter 23; wherein the molding compound 26 is made of a ceramic material, a plastic material or a metal material.

Finally, a component stack method is used to integrate the SAW filter and the transceiver 22 into an integrated chip 20.

Figure 3:
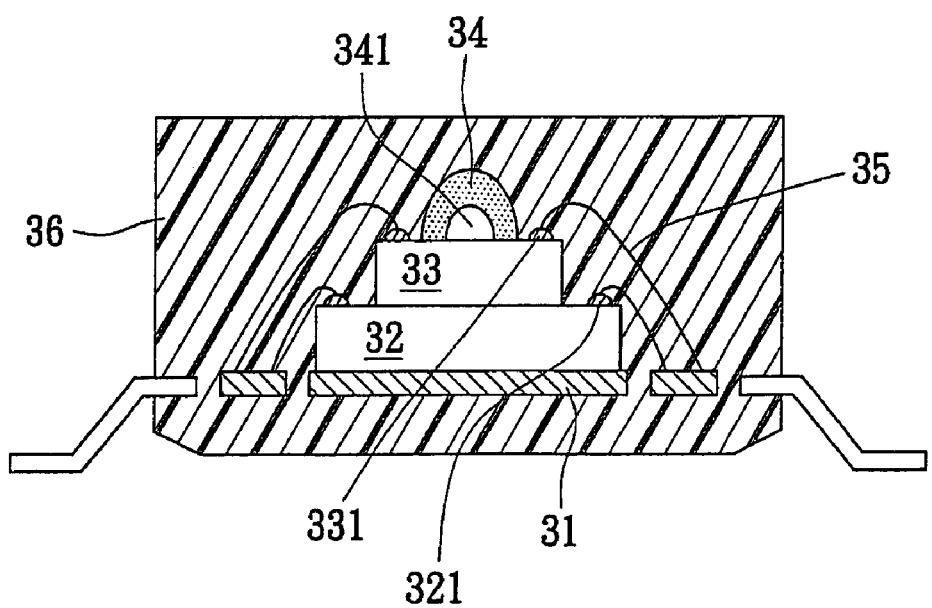
FIG. 3 is a schematic view of a device for integrating a surface acoustic wave (SAW) filter and a transceiver according to another preferred embodiment of the invention.

Please refer to FIG. 3 accompanied with FIG. 2. FIG. 3 shows the structure of a device for integrating a SAW filter and a transceiver according to another preferred embodiment of the present invention, and their major difference resides on that the lead frame 31 as shown in FIG. 3 can substitute the substrate 21 as shown in FIG. 2 as to dispose the transceiver 32 on a chip substrate of the lead frame 31. Owing to the conductivity of the lead frame 31, the substrate 21 on the conductive layer 211 as shown in FIG. 2 is no longer needed. Therefore, the transceiver 32, the SAW filter 33 and the lead frame 31 can be electrically connected by a lead for the circuit design.

Figure 4:
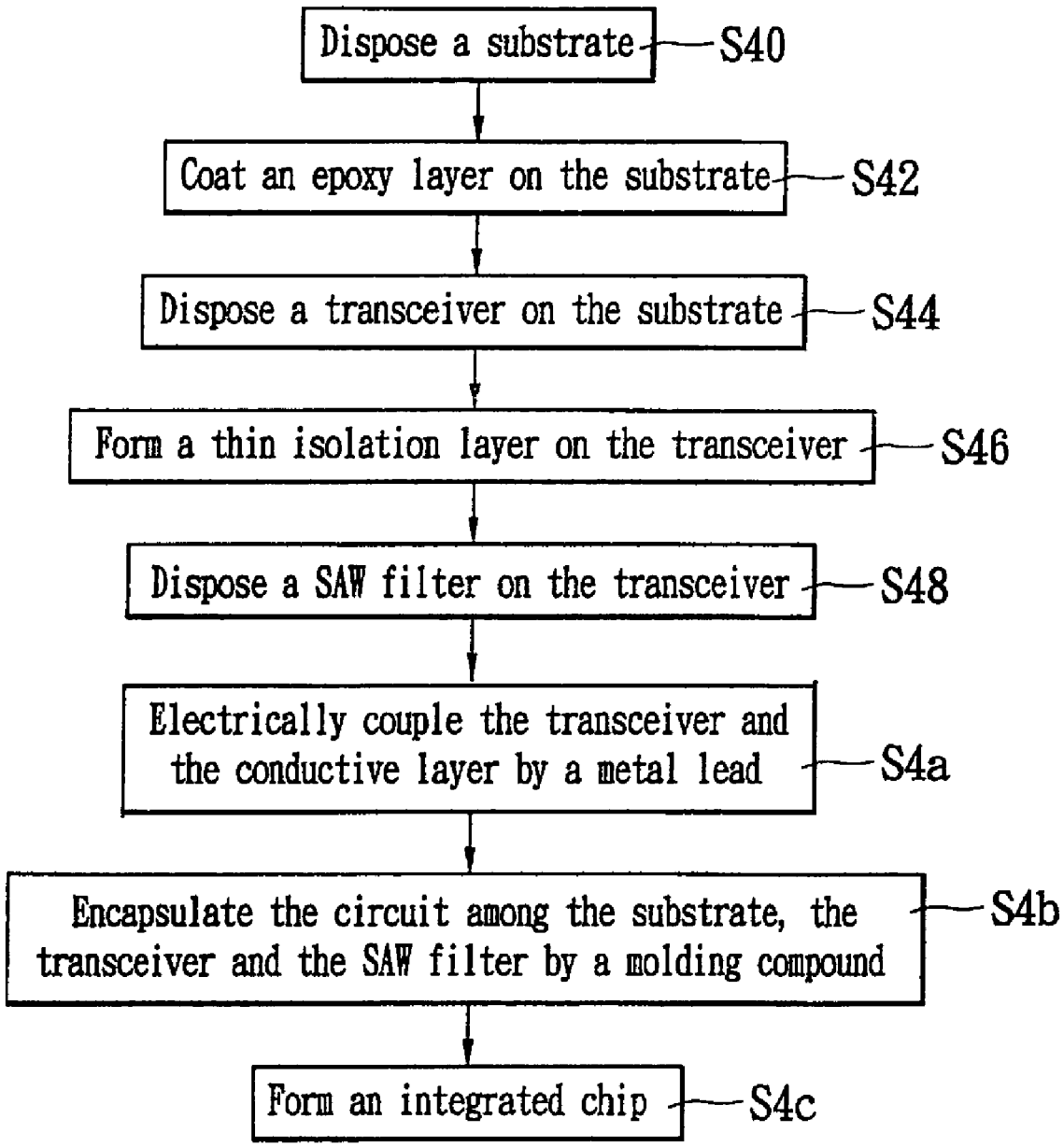
FIG. 4 is a flow chart of the method for integrating a surface acoustic wave (SAW) filter and a transceiver according to the invention.

Please refer to FIG. 4 for the flow chart of the method for integrating a SAW filter and a transceiver according to the present invention. The method comprises the steps of firstly disposing a substrate (Step 40); coating an epoxy layer on the substrate (Step 42); disposing a transceiver on the substrate (Step 44), forming a thin isolation layer on the transceiver (Step 46), disposing a SAW filter on the transceiver (Step 48); electrically coupling the transceiver and the conductive layer by a metal lead (Step 4a); encapsulating the circuit among the substrate, the transceiver and the SAW filter by a molding compound (Step 4b); and forming an integrated chip (Step 4c).

Please refer to FIG. 4. The substrate used in Step 40 could be a semiconductor substrate or a glass substrate; the epoxy layer used in Step 42 could be a silver epoxy; and the transceiver used in Step 44 could install a plurality of pads around it to facilitate a later circuit connection. Similarly, the SAW filter used in Step 48 could also install a plurality of pads around it to facilitate a later circuit connection.

Further, an air cavity covers the SAW filter and keeps a gap between the air cavity and the SAW filter in Step 48, and the air cavity is made of a semiconductor material or a glass material. The gap can be filled with various gases or kept in a vacuum. The molding compound used in Step 4b could be a compound of a ceramic material, a plastic material or a metal material.

Figure 5:
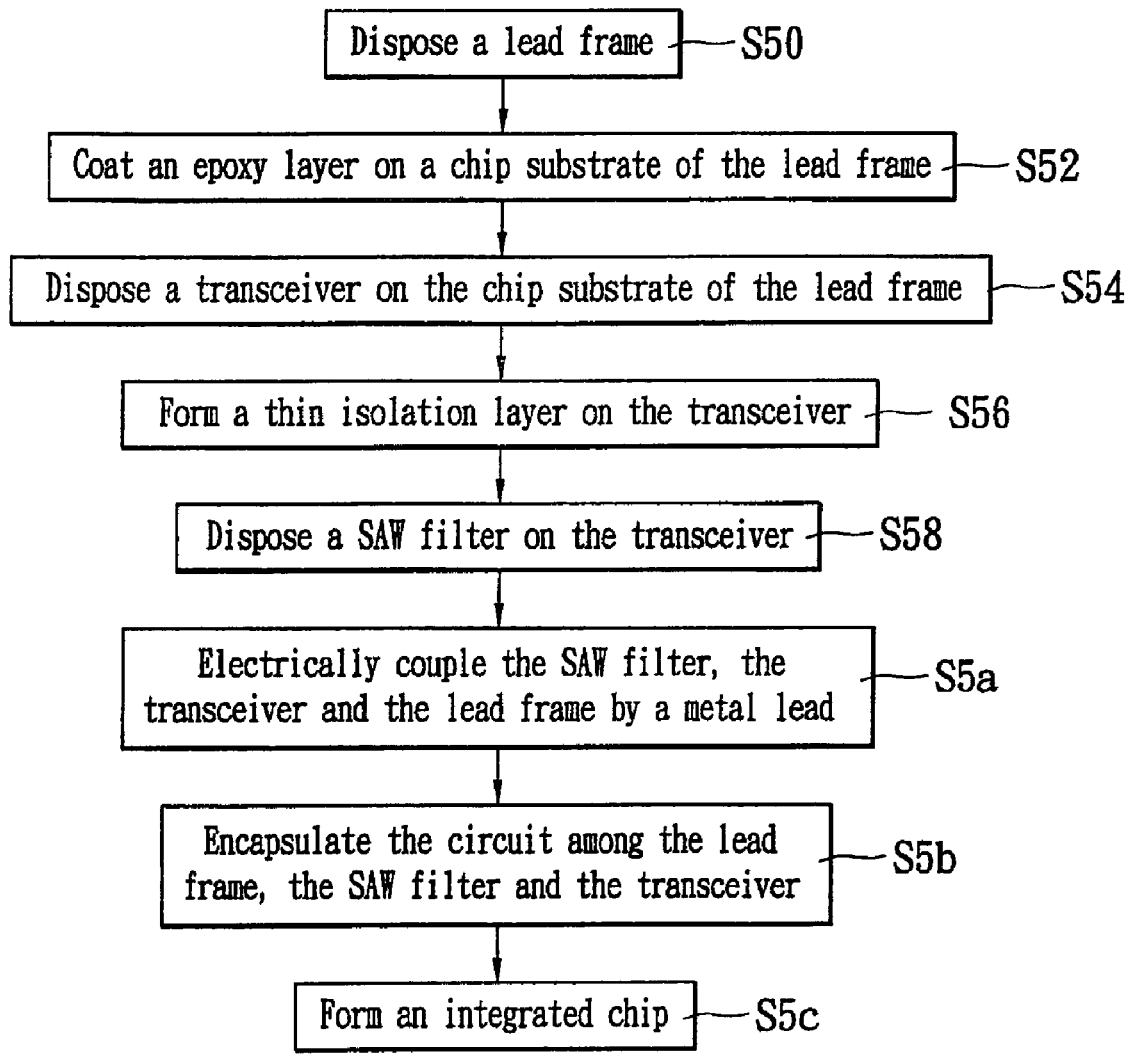
FIG. 5 is a flow chart of the method for integrating a surface acoustic wave (SAW) filter and a transceiver according to another preferred embodiment of the invention.

Please refer to FIG. 5 accompanied with FIG. 4. FIG. 5 shows a flow chart of the method of integrating a SAW filter and a transceiver according to another preferred embodiment of the present invention. The method comprises the steps of: disposing a lead frame (Step 50); coating an epoxy layer on a chip substrate of the lead frame (Step 52); disposing a transceiver on the chip substrate of the lead frame (Step 54); forming a thin isolation layer on the transceiver (Step 56); disposing a SAW filter on the transceiver (Step 58); electrically connecting the SAW filter, the transceiver and the lead frame by a metal lead (Step 5a); encapsulating the circuit among the lead frame, the transceiver and the SAW filter by a molding compound (Step 5b); and forming an integrated chip (Step 5c).

Please refer to FIG. 4. The epoxy layer used in Step 52 could be a silver epoxy, and the transceiver in Step 54 comprises a plurality of pads around it to facilitate a later circuit connection. Similarly, the SAW filter used in Step 58 could also install a plurality of pads around it to facilitate a later circuit connection.

Further, an air cavity covers the SAW filter and keeps a gap between the air cavity and the SAW filter in Step 58, and the air cavity could be a semiconductor material or a glass material. The gap can be filled with various gases or kept in a vacuum. The molding compound used in Step 5b could be a compound made of a ceramic material, a plastic material or a metal material.

The method and apparatus for integrating a SAW filter and a transceiver according to the present invention can further integrate other components and chips into the package design to fit various integrated circuit packaging technologies (such as the QFP and BGA, etc), in addition to the advantages of having a low cost and small area as well as avoiding signal loss.

In summation of the above description, the present invention herein enhances the performance than the conventional structure and further complies with the patent application requirements and is submitted to the Patent and Trademark Office for review and granting of the commensurate patent rights.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A device for integrating a surface acoustic wave (SAW) filter and a transceiver, comprising:
   a substrate, forming a conductive layer thereon for connecting a circuit;
   a transceiver, being disposed on said substrate and electrically coupled with said conductive layer by a metal lead;
   a surface acoustic wave filter, being disposed on said transceiver and covered by an air cavity and having a gap reserved between said air cavity and said surface acoustic wave filter, and said conductive layer being electrically coupled with said surface acoustic wave components; and a molding compound, for encapsulating the circuit among said substrate, said transceiver and said surface acoustic wave filter;

thereby, a component stack method is used to accomplish the integration of said surface acoustic wave filter and said transceiver.

2. The device for integrating a surface acoustic wave (SAW) filter and a transceiver of claim 1, wherein said substrate is made of a semiconductor substrate or a glass substrate.

3. The device for integrating a surface acoustic wave (SAW) filter and a transceiver of claim 1, wherein said air cavity is made of a semiconductor material or a glass material.

4. The device for integrating a surface acoustic wave (SAW) filter and a transceiver of claim 1, wherein said gap between said air cavity and said surface acoustic wave filter is in a vacuum or filled with a gas.

5. The device for integrating a surface acoustic wave (SAW) filter and a transceiver of claim 1, wherein said molding compound is made of a ceramic material, a plastic material or a metal material.

6. A device for integrating a surface acoustic wave (SAW) filter and a transceiver of claim 1, comprising:
a lead frame, for connecting a circuit;
a transceiver, being disposed on a chip substrate and electrically coupled with said lead frame by a metal lead;
a surface acoustic wave filter, being disposed on said transceiver and covered by an air cavity and having a gap reserved between said air cavity and said surface acoustic wave filter, and said conductive layer being electrically coupled with said surface acoustic wave components; and
a molding compound, for encapsulating the circuit among said substrate, said transceiver and said surface acoustic wave filter;
thereby, a component stack method is used to accomplish the integration of said surface acoustic wave filter and said transceiver.

7. The device for integrating a surface acoustic wave (SAW) filter and a transceiver of claim 6, wherein said substrate is made of a semiconductor substrate or a glass substrate.

8. The device for integrating a surface acoustic wave (SAW) filter and a transceiver of claim 6, wherein said gap between said air cavity and said surface acoustic wave filter is in a vacuum or filled with a gas.

9. The device for integrating a surface acoustic wave (SAW) filter and a transceiver of claim 6, wherein said molding compound is made of a ceramic material, a plastic material or a metal material.

10. A method for integrating a surface acoustic wave (SAW) filter and a transceiver, comprising the steps of:
disposing a substrate;
coating an epoxy layer on said substrate;
disposing a transceiver on said substrate;
forming a thin isolation layer on said transceiver;
disposing a surface acoustic wave (SAW) filter on said transceiver;
electrically coupling said SAW filter, said transceiver and said conductive layer by a metal lead;
encapsulating the circuit among said substrate, said transceiver and said SAW filter by a molding compound; and
shaping an integrated chip.

11. The method for integrating a surface acoustic wave (SAW) filter and a transceiver of claim 10, wherein said substrate used in the step of disposing a substrate is a semiconductor substrate or a glass substrate.

12. The method for integrating a surface acoustic wave (SAW) filter and a transceiver of claim 10, further comprising an air cavity that covers said SAW filter and reserves a gap from said SAW filter in the step of disposing said SAW filter on said transceiver.

13. The method for integrating a surface acoustic wave (SAW) filter and a transceiver of claim 12, wherein said air cavity is made of a semiconductor substrate or a glass material in the step of disposing said SAW filter on said transceiver.

14. The method for integrating a surface acoustic wave (SAW) filter and a transceiver of claim 12, wherein said gap is in a vacuum or filled with a gas in the step of disposing said SAW filter on said transceiver.

15. The method for integrating a surface acoustic wave (SAW) filter and a transceiver of claim 10, wherein said molding compound is made of a ceramic material, a plastic material or a metal material in said encapsulation step.

16. A method for integrating a surface acoustic wave (SAW) filter and a transceiver, comprising the steps of:
disposing a lead frame;
coating an epoxy layer on a chip substrate of said lead frame;
disposing a transceiver on said chip substrate of said lead frame;
forming a thin isolation layer on said transceiver;
disposing a SAW filter on said transceiver;
electrically coupling said SAW filter, said transceiver and said lead frame by a metal lead;
encapsulating the circuit among said lead frame, said SAW filter and said transceiver; and
forming an integrated chip.

17. The method for integrating a surface acoustic wave (SAW) filter and a transceiver of claim 16, further comprising an air cavity that covers said SAW filter and reserves a gap from said SAW filter in the step of disposing said SAW filter on said transceiver.

18. The method for integrating a surface acoustic wave (SAW) filter and a transceiver of claim 17, wherein said air cavity is made of a semiconductor substrate or a glass material in the step of disposing said SAW filter on said transceiver.

19. The method of integrating a surface acoustic wave (SAW) filter and a transceiver of claim 17, wherein said gap is in a vacuum or filled with a gas in the step of disposing said SAW filter on said transceiver.

20. The method of integrating a surface acoustic wave (SAW) filter and a transceiver of claim 16, wherein said molding compound is made of a ceramic material, a plastic material or a metal material in said encapsulation step.

* * * * *